(12) United States Patent
Coico et al.

(10) Patent No.: US 6,354,844 B1
(45) Date of Patent: Mar. 12, 2002

(54) LAND GRID ARRAY ALIGNMENT AND ENGAGEMENT DESIGN

(75) Inventors: Patrick A. Coico, Fishkill; Benjamin V. Fasano, New Windsor, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/459,552

(22) Filed: Dec. 13, 1999

(51) Int. Cl.[7] ............................................. H01R 12/00
(52) U.S. Cl. ........................... 439/66; 439/74; 439/260; 439/525
(58) Field of Search .................. 439/68, 69, 70, 439/71, 72, 73, 66, 525, 74, 526, 260

(56) References Cited

U.S. PATENT DOCUMENTS

| | | | |
|---|---|---|---|
| 5,364,286 A | 11/1994 | Matsuoka | 439/330 |
| 5,413,489 A | * 5/1995 | Switky | 439/71 |
| 5,713,744 A | 2/1998 | Laub | 439/71 |
| 5,772,451 A | * 6/1998 | Dozier, II et al. | 439/70 |
| 5,791,914 A | * 8/1998 | Loranger et al. | 439/71 |
| 5,802,699 A | 9/1998 | Fjelstad et al. | 29/593 |
| 5,805,419 A | 9/1998 | Hundt et al. | 361/719 |
| 5,833,471 A | 11/1998 | Selna | 439/73 |

* cited by examiner

Primary Examiner—Tho D. Ta
Assistant Examiner—Truc T Nguyen
(74) Attorney, Agent, or Firm—Margaret A. Pepper; John A. Jordan

(57) ABSTRACT

A Land Grid Array electronic package having an array of contact pads is connected to a corresponding array of contact pads on a circuit board through a matching array of conductive pins of a flexible interposer. Alignment of the electronic package to the flexible interposer and flexible interposer to the circuit board is obtained by registration of alignment components to the contact pads and conductive pins. A pair of alignment components, such as pin-like alignment structures, on selected pads of both the electronic package and circuit board mate within alignment holes at the sites of corresponding pin locations in said flexible interposer. Alternatively, the pin-like alignment structures on the electronic package can be extended to pass through the said alignment holes of said flexible interposer into alignment holes which replace the pin-like alignment structure on said circuit board.

19 Claims, 2 Drawing Sheets

LAND GRID ARRAY ALIGNMENT AND ENGAGEMENT DESIGN

BACKGROUND OF THE INVENTION

1. Field of the Invention

The present invention relates, in general, to an arrangement for making electrical interconnection of electronic devices and, more particularly, to structural components for the alignment and engagement of electronic packages to interposers or sockets and interposers or sockets to printed circuit boards in the interconnection and assembly of electronic devices.

2. Background and Related Art

Shrinking integrated circuit dimensions and greater functionality have dramatically increased the number of input/output connections to integrated circuit packages while decreasing the dimensions available for making the connections. As the requirement for larger numbers of interconnections between integrated circuit chip packages and the boards or cards to which they are attached drives the size and spacing of the interconnect features of the connection points to smaller and smaller values, the difficulty of accurately aligning these features increases. The trend will continue in the foreseeable future. Certain types of packaging interconnect schemes, such as pin connector designs, will not be able to meet the requirements of this fine pitch input/output regime. One packaging interconnect scheme that will be able to meet the requirements of the fine pitch input/output regime is Land Grid Array (LGA) packaging technology. One key packaging advantage of the Land Grid Array is that the connection features on the package and the board are, quite simply, properly prepared plated pads. To make good electrical connection between package and board, all that is needed between the pads on the package and pads on the board is a compliant, conductive interposer or socket that conforms to variables in smoothness and surface flatness of the integrated circuit package and circuit board. In such schemes, the package is pressed against the card with the interposer between by means of a pressure plate, clamping screws and backing plate. One of the difficulties of the Land Grid Array approach to packaging is effective alignment of the packages to the interposer and the interposer to the circuit board.

Various arrangements have been proposed for aligning electronic packages to circuit boards. For example U.S. Pat. No. 5,738,531 to Beaman, et al., describes a self-aligning, low profile, socket using a dendritic interposer for connecting ball grid array packages. U.S. Pat. No. 5,473,510 discloses a land grid array package/circuit board assembly using alignment posts on the interposer for aligning the integrated package to the interposer and interposer to the board.

One difficulty with these and other known packaging techniques resides in the fact that alignment relies upon registration points, such as the edge of the chip substrate in the electronic package. This in turn is highly dependent on the registration of the I/O pads on the substrate to the edge of the substrate at the time the substrate is cut into what will determine its final size. It is well known that input/output pad-to-edge registration is difficult to maintain, particularly when substrates are cut from large panels or laminates. In addition, subsequent processing, such as firing of ceramic substrates, can sometimes result in significant dimensional changes due to shrinkage.

Another difficulty with known packaging techniques resides in the fact that alignment holes are often required in the chip substrate. To place holes in ceramic substrates accurately requires their formation after sintering, with the location of the holes determined in accordance with some form of registration process. The placement of holes into a sintered substrate is difficult due to its extreme hardness and involves slow and costly processes.

SUMMARY OF THE INVENTION

In accordance with the teachings of the present invention, the high density contact requirements of state-of-the-art high density input/output integrated circuit packages is met by simple, accurate and low cost alignment means. More particularly, new and improved alignment means are employed to align the electronic package to the flexible interposer or socket and the flexible interposer or socket to the circuit board. Alignment components are formed with respect to each of the electronic package, flexible interposer and circuit board parts. In accordance with further teachings of the present invention, precise positioning of these alignment components on the respective parts is achieved by forming the components in registration with selected contact pads of the electronic package and/or circuit board and selected pin locations of the array of pin locations of the flexible interposer. By so doing, alignment of these parts at their respective connection points is precisely achieved without the need of registration using a remote, less accurate point of reference.

In one embodiment, alignment pins are positioned and attached to two contact pads on the electronic package substrate and two alignment holes are formed at corresponding contact pad positions on the circuit board. In addition, two alignment holes are formed at corresponding conductive pin locations or positions in the flexible interposer. The alignment pins pass through the alignment holes in the flexible interposer and into the alignment holes in the circuit board. In another embodiment, positioning elements, in the form of shorter pin-like structures, such as solder balls, or the like, are attached to pads at corresponding positions on both the electronic package and circuit board so as to seat within the alignment holes in the flexible interposer.

Accordingly, it is an object of the present invention to provide an improved electronic package interconnection and alignment arrangement.

It is a further object of the present invention to provide an electronic package utilizing an alignment scheme which provides effective electrical connection in a simple, cost effective manner.

It is yet a further object of the present invention to provide effective alignment of electrical connection points in a Land Grid Array package.

It is another object of the present invention to provide improved alignment means for aligning an electronic package to an interposer or socket and an interposer or socket to a circuit board in Land Grid Array technology.

The foregoing and other objects, features and advantages of the invention will be apparent from the following more particular description of a preferred embodiment of the invention, as illustrated in the accompanying drawings wherein like reference numbers represent like parts of the invention.

DETAILED DESCRIPTION

Figure 1:
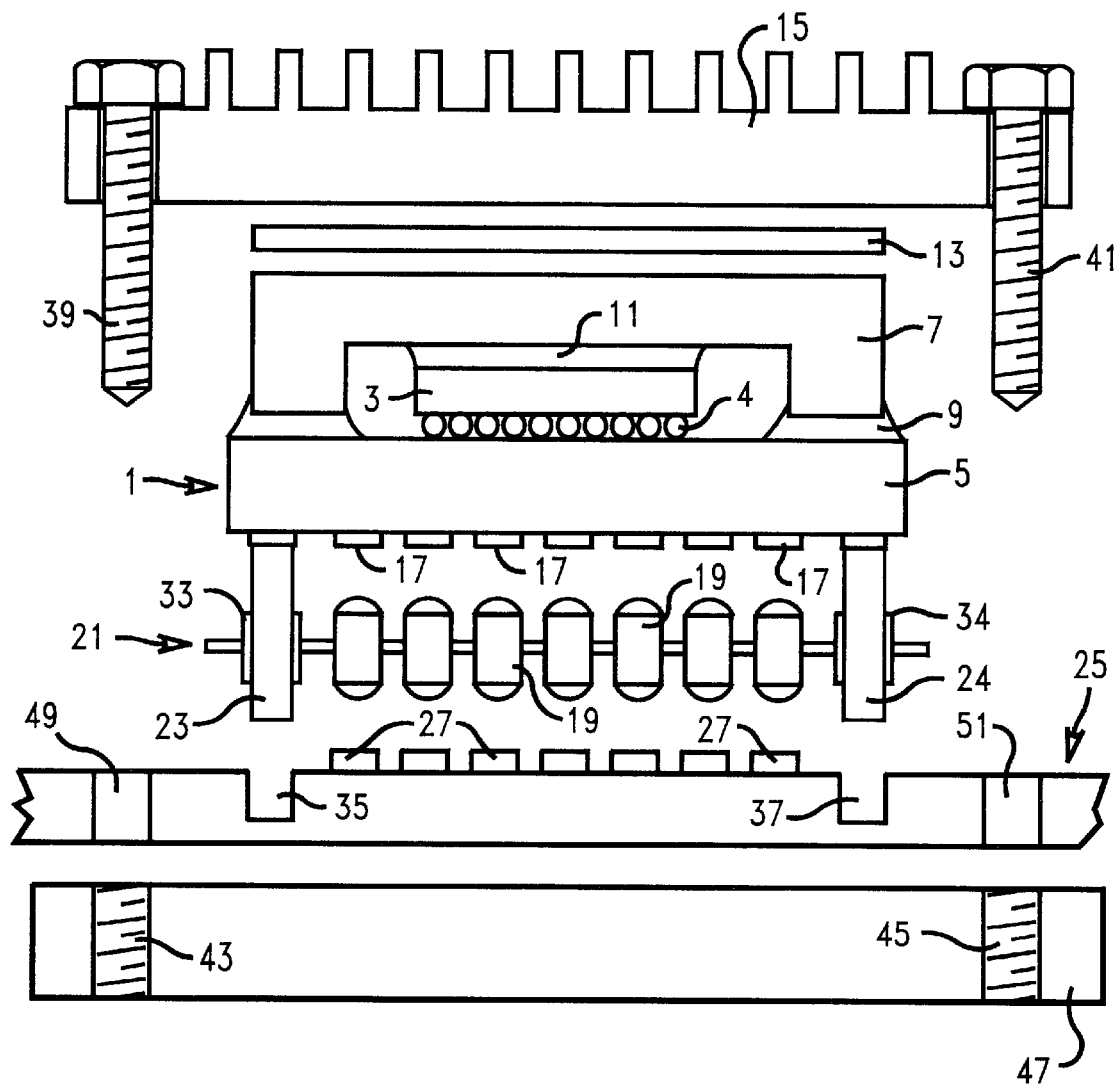
FIG. 1 shows a cross-sectional view of one embodiment of the Land Grid Array package/circuit board assembly with alignment means, in accordance with the present invention.

With particular reference to the Land Grid Array (LGA) package/circuit board assembly shown in cross-section in FIG. 1, the LGA electronic package 1 comprises semiconductor chip 3 mounted via solder balls 4 to contact pads (not shown) on substrate 5. Cap 7 encloses chip 3 and is held to substrate 5 by any of a variety of known means 9, such as an epoxy adhesive. Cap 7 may be made from any of a variety of known materials typically used for this purpose, such as aluminum. Thermal transfer compound 11, such as a thermally enhanced epoxy, may be used between chip 3 and cap 7 to further secure chip 3 and to help dissipate heat. Further heat dissipation may be facilitated by thermal enhancement layer 13 which may be any of a variety of highly heat conductive flexible material used to ensure good conformal contact between pressure plate 15 and cap 7, when assembled. When assembled, thermal enhancement layer 13 is compressed between cap 7 and pressure plate 15, the latter of which acts to both apply pressure to the LGA electronic package and dissipate heat from chip 3, as shown by the integral heat sink fins on its top surface. Pressure plate 15 may be made of any rigid material, such as steel, suitable to provide a uniform load distribution.

In accordance with one embodiment of the present invention, to accurately and simply align the two-dimensional array of contact pads 17 on substrate 5 with the two-dimensional array of conductive pins 19 of flexible interposer 21, a pair of alignment pins 23 and 24 are fabricated on selected ones of pads 17 on substrate 5. The alignment pins 23 and 24 may be aligned and joined to the contact pads by use of an adhesive or solder. Use of conventional solder reflow techniques would tend to self-align the alignment pins to the contact pads. Although use of a pair of alignment pins has been described, it is clear that more than two pins could be used, if desired, although this would necessitate using additional input/output connections. In this regard, fabricating the alignment pins on unused contact pads would be advantageous.

Figure 2:
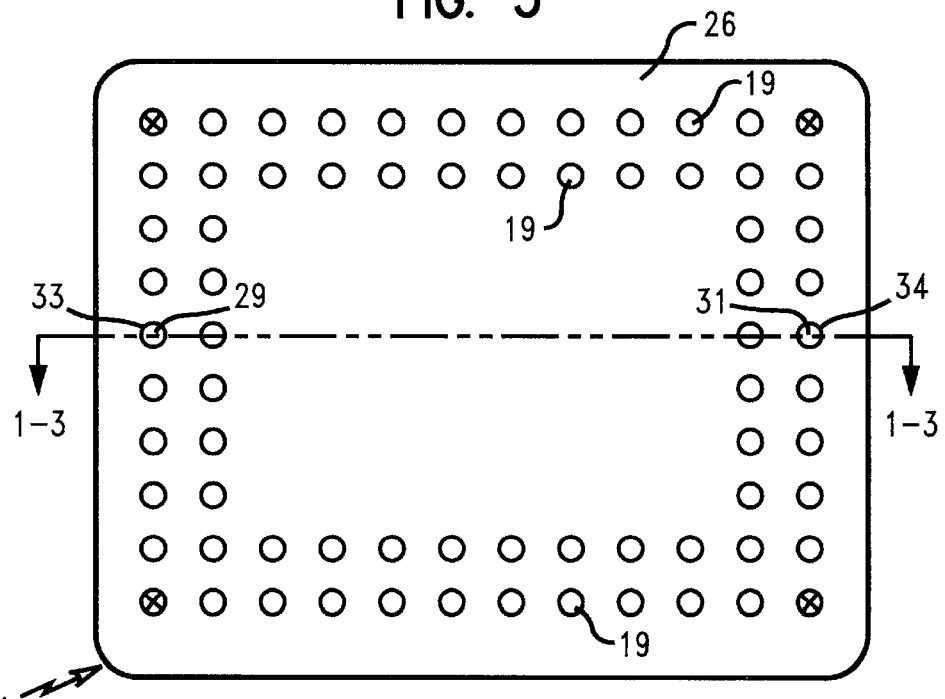
FIG. 2 is a top view of the flexible interposer or socket used between the electronic package and circuit board in accordance with the arrangement shown in FIG. 1.

A top view of the flexible interposer 21 is shown in FIG. 2. As shown, a two-dimensional array of conductive pins 19 is formed in flexible sheet 26. Interposer sheet 26 may be made from a thin dielectric elastomer sheet, such as Kapton or Driclad. To fabricate the interposer, a two-dimentional array of holes is first formed in the sheet and then the holes are filled with a somewhat compressible conductive material, such as a conductive wire or metal filled elastomer. The pattern of the array of pins 19 matches the pattern of the two-dimentional array of contact pads 17 on the underside of substrate 5, as described with respect to FIG. 1. Typically, the dielectric elastomer sheet would be around 5 mils thick and the pins would be around 25 to 30 mils in diameter and extend, in length, above and below the elastomer sheet with the diameter of the pins approximating the size of the contact pads 17.

To align the array of contact pads 17 on substrate 5 of electronic package with the array of conductive pins 19 in interposer 21, a pair of alignment holes are formed in interposer 21 at pin sites selected to match the location of pads 17 upon which alignment pins 23 and 24 are mounted. To maximize use of input/output space, the location of unused pads on substrate 5 and corresponding unused pin sites on interposer 21 could be selected for the alignment pins and alignment holes. Interposer 21 is shown in FIG. 1 in cross-section, as taken along line 1–3 in FIG. 2. Although FIG. 2 shows use of a pair of alignment holes 29 and 31 near the midpoint of interposer 21, it is clear that the alignment holes and corresponding alignment pins on substrate 5 could be selected at other pin sites and pad sites, such as sites on diagonal corners or adjacent corners of interposer 21 and substrate 5. This is shown by the x's in holes in FIG. 2. Likewise, although two alignment holes are, in most cases, sufficient for alignment purposes, it is clear that more than two alignment holes and corresponding alignment pins could be used. It is also possible that the alignment elements themselves could be used for both alignment and electrical conducting purposes. For example, alignment pins 23 and 24 could be inserted into metal-plated holes connected to some form of metallurgy and used to carry power or some form of device signal.

To facilitate insertion of alignment pins 23 and 24 in FIG. 1 into respective alignment holes 29 and 31, shown in both FIG. 1 and FIG. 2, metal sleeves 33 and 34 may be fixed in these holes to readily receive these pins. The inside diameter of sleeves 33 and 34 should be such as to allow easy insertion of the alignment pins with, however, very little space between pin and sleeve to minimize any lateral misalignment.

To align pads 27 on circuit board 25 with pins 19 in interposer 21, a pair of alignment holes 35 and 37 are formed in the circuit board. In accordance with the present invention, this alignment is achieved using the same approach as was employed to align pads 17 on substrate 5 with pins 19 in interposer 21. More particularly, alignment holes 35 and 37 are formed in circuit board 25 at pad 27 sites which match the sites of pads 17 on substrate 5 which were used to mount alignment pins 23 and 24. By so doing, alignment of substrate 5, to interposer 21 and circuit board 25 is simply and accurately obtained without the need for registration to some external point, such as substrate edge, outside the footprint of the input/output pad array. This removes substrate sizing tolerances, for example, from the tolerance analysis that determines the accuracy of alignment. In effect, the alignment scheme in accordance with the present invention relies on the fact that pad-to-pad true position is very accurate in input/output arrays and utilization of the pads for alignment results in highly accurate positional relationship of the three devices so aligned. In addition, with the alignment components located within the area of the input/output footprint, no frame is required on socket 21 and valuable surface perimeter wiring area on circuit board 25 is saved over what otherwise would be used by a frame outside the input/output array.

When assembled, alignment pins 23 and 24 are engaged in alignment holes 35 and 37 and clamping screws 39 and 41 are appropriately tightened into threaded holes 43 and 45 in backing plate 47 through holes 49 and 51 in circuit board 25. When tightened in place, pressure plate 15 applies sufficient force to substrate 5 to cause pins 19 in interposer 21 to variously minimally compress to conform to variations in surface flatness and roughness of circuit board 25 and substrate 5.

Figure 3:
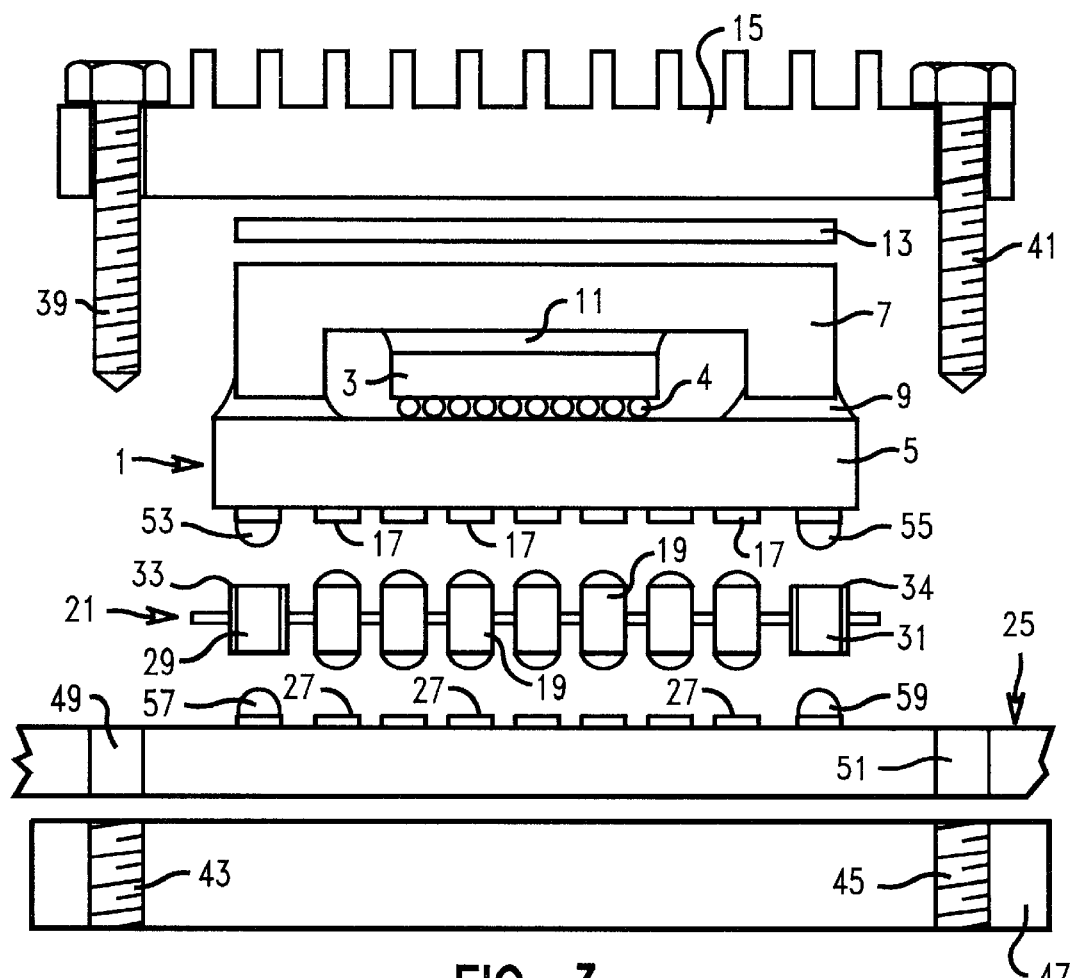
FIG. 3 shows a cross-sectional view of another embodiment of the Land Grid Array package/circuit board assembly with alignment means, in accordance with the present invention.

FIG. 3 shows a further embodiment of the present invention wherein the alignment means are pairs of protruding alignment components on both substrate and circuit board for engagement into holes in the interposer or socket. Like reference numerals are used in FIG. 3 for like elements in FIG. 1. As can be seen, rather than use the relatively long alignment pins 23 and 24 as was done in FIG. 1, a pair of relatively short alignment components, such as short pins or solder balls 53 and 55, are used. As is clear, the alignment components here do not pass through interposer 21 but rather seat within sleeves 33 and 34 and must be sized in height so as to not interfere with the seating of corresponding alignment components 57 and 59 on circuit board 25. Each of the sets of alignment components 53 and 55, and 57 and 59, must respectively seat within the sleeves 33 and 34 of alignment holes 29 and 31 in interposer 21, shown in FIG. 2. In this regard, the alignment holes of interposer 21 used in FIG. 3 are formed and positioned in the same manner as was described with respect to FIGS. 1 and 2. The pair of alignment components 53 and 55 are formed on the same pad sites selected for pins 23 and 24 in FIG. 1 which sites match the position of holes 29 and 31 in interposer 21. These components may be fixed to the pad sites by an adhesive or solder and, as was described with regard to FIG. 1, use of soldering techniques would tend to self-align the component to the pads. Similarly, alignment components 57 and 59 are formed on pad 27 sites of circuit board 25 corresponding to those used for alignment holes 35 and 37 in FIG. 1, which sites match the position of alignment holes 29 and 31 in interposer 21.

Alignment components 53, 55, 57 and 59 may be short pin-like structures, as shown in FIG. 3, with a pin length one-half or less than the length of sleeves 33 and 34. Other component shapes could also be used. Whatever its shape, the component must be sized to precisely fit within the sleeve of the alignment hole without freedom to move laterally. It is clear that the alignment components must seat sufficiently into the alignment holes when assembled to allow interposer pins 19 to contact the array of pads 17 and 27 and compress to conform to variations in surface flatness of substrate 5 and circuit board 25.

In this regard, the alignment components 53, 55, 57 and 59, as shown in FIG. 3, are positioned to seat (from above and below) within holes 29 and 31 in FIG. 2. It should be clear, however, that one set of alignment holes in interposer 21 could be used to seat and align components 53 and 55 from the top and another set of alignment holes could be used to seat and align components 57 and 59 from below. This later scheme may help minimize the overall height of the package. It should also be clear that in either of the above alignment component arrangements, the components could also be used, as described with respect to FIG. 1, to carry power or some form of signal. Likewise, as was described with respect to FIG. 1, the position and number of alignment components and corresponding alignment holes may vary so long as there are at least two alignment components and two corresponding alignment holes for both the substrate and circuit board. It should be noted that although the terms "alignment components", "alignment holes" and "alignment pins" have been used herein with regard to the electronic package, flexible interposer and circuit board, it is to be understood that the term "alignment components" should be taken to be generic and cover, at least, all three terms.

As has been described, use of input/output pads as the registration point for alignment of substrates to circuit boards provides precise means of aligning and that using the pads themselves for the alignment components saves space and offers a simple means of precisely aligning substrate to interposer and interposer to circuit board. Alternatively, it is also possible to use the input/output pads as a registration point for optically aligning alignment components positioned external to the input/output footprint. For example, alignment pins could be formed as an integral part of the substrate cap outside the input/output footprint with the alignment pins positioned by optical registration to the substrate pads.

Likewise, corresponding alignment holes could be formed in interposer and circuit board with these alignment holes positioned on their respective parts by optical registration to pins in the case of the interposer and pads in the case of the circuit board.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. In an electronic package-circuit board assembly including an electronic package, flexible interposer and circuit board with said flexible interposer having an array of conductive pins for connecting an array of contact pads on said electronic package to a corresponding array of contact pads on said circuit board, the improvement comprising:

a first pair of alignment components attached to said electronic package each positioned with fixed reference to respective selected ones of said array of contact pads on said package;

a second pair of alignment components attached to said flexible interposer each positioned with said fixed reference to respective selected ones of said array of conductive pins of said flexible interposer with said respective selected ones of said array of conductive pins corresponding in position to the position of said respective selected ones of said contact pads on said electronic package; and a third pair of alignment components attached to said circuit board each positioned with said fixed reference to respective selected ones of said array of contact pads on said circuit board with said respective selected ones of said array of contact pads on said circuit board corresponding in position to the position of said respective selected ones of said array of conductive pins of said flexible interposer.

2. The electronic package-circuit board assembly as set forth in claim 1 wherein said first pair of alignment components are respectively positioned on top of a pair of selected ones of said array of contact pads on said electronic package.

3. The electronic package-circuit board assembly as set forth in claim 2 wherein said second pair alignment components are alignment holes in said flexible interposer positioned at the respective sites of a pair of alignment pins corresponding in location to the location of said pair of selected ones of contact pads on said electronic package.

4. An electronic package-circuit board assembly as set forth in claim 3 wherein said third pair of alignment components are respectively positioned on top of a pair of contact pads on said circuit board corresponding in location to the location of said alignment holes in said flexible interposer.

5. The electronic package-circuit board assembly as set forth in claim 4 wherein said first pair of alignment components are a pair of alignment pins and said third pair of alignment components are a pair of alignment holes such that said pair of alignment pins respectively pass through said pair of alignment holes in said flexible interposer and into said pair of alignment holes in said circuit board.

6. The electronic package-circuit board assembly as set forth in claim 4 wherein said first and third pair of alignment components are pairs of protruding elements whose height is no more than one-half the depth of the alignment holes of said pair of alignment holes in said flexible interposer.

7. The electronic package-circuit board assembly as set forth in claim 5 wherein said pair of alignment holes in said circuit board are plated with conductive material connected to metallurgy to allow said respective alignment pins to conduct electricity.

8. The electronic package-circuit board assembly as set forth in claim 6 wherein said pair of alignment holes in said circuit board are plated with conductive material connected to metallurgy to allow said respective alignment pins to conduct electricity.

9. An assembly comprising:
    an electronic package having an array of contact pads with at least two of said contact pads having positioned thereon alignment components;
    a circuit board having an array of contact pads matching the array of said contact pads on said electronic package with at least two of said pads having positioned thereon alignment components corresponding in location to the location of the said alignment components of said electronic package; and
    a flexible interposer positioned between said electronic package and said circuit board and having an array of holes filled with conductive pins at all locations matching the position of the respective positions of said array of contact pads on said electronic package and circuit board except those locations corresponding to the locations of the said at least two of said contact pads on each of said electronic package and circuit board to thereby provide alignment holes for engaging said alignment components on said electronic package and circuit board.

10. The assembly of claim 9 wherein the said alignment components on said electronic package and circuit board are round protrusions.

11. The assembly of claim 9 wherein the said alignment components on said electronic package are alignment pins and wherein the said alignment components on said circuit board are alignment holes such that said alignment pins extent through said alignment holes of said flexible interposer and into the said alignment holes in said circuit board.

12. The claim as set forth in claim 11 wherein the said alignment holes in said circuit board have conductive walls connected to metallurgy such that said alignment pins may operate to both align said assembly and carry electrical current.

13. The assembly of claim 10 wherein said round protrusions are pin-like structures.

14. The assembly of claim 10 wherein said round protrusions are solder balls.

15. An electronic package-circuit board assembly comprising:
    an electronic package having an array of contact pads, and a pair of alignment components for said assembly respectively positioned on said electronic package on a selected pair of said contact pads;
    a flexible interposer having an array of conductive pins matching said array of contact pads on said electronic package and having a pair of alignment holes therein located at respective pin sites similarly positioned on said interposer as said pair of alignment components on said electronic package; and
    a circuit board having an array of contact pads matching said array of conductive pins on said flexible interposer and having a pair of alignment components respectively positioned on said circuit board on a pair of contact pads similarly positioned on said circuit board as said pair of alignment holes in said flexible interposer.

16. The electronic package-circuit board assembly as set forth in claim 15 wherein said pair of alignment components of said electronic package are a pair of alignment pins and said pair of alignment components of said circuit board are a pair of alignment holes such that said pair of alignment pins respectively pass through said pair of alignment holes in said flexible interposer and into said pair of alignment holes in said circuit board.

17. The electronic package-circuit board assembly as set forth in claim 15 wherein said pair of alignment components on each of said electronic package and said circuit board are a pair of protruding elements whose height is no more than one-half the depth of the alignment holes of said pair of alignment holes in said flexible interposer such that the said pair of protruding elements of both said electronic package and circuit board engage said pair of alignment holes in said flexible interposer.

18. An electronic package-circuit board assembly comprising:
    an electronic package having an array of contact pads, and a pair of alignment components for said assembly respectively positioned on a selected pair of contact pads of said array of contact pads of said electronic package;
    a flexible interposer having an array of conductive pins matching said array of contact pads on said electronic package and having a pair of alignment components for said assembly respectively positioned on said interposer at alignment sites that match the location of said pair of alignment components on said electronic package; and
    a circuit board having an array of contact pads matching said array of conductive pins on said flexible interposer and having a pair of alignment components for said assembly respectively positioned at alignment sites on said circuit board that match the location of said pair of alignment components on said flexible interposer.

19. The electronic package-circuit board assembly as set forth in claim 18 wherein said pair of alignment components of said flexible interposer are alignment holes in said interposer respectively positioned at a pair of conductive pin sites matching in location the location of said selected pair of contact pads on said electronic package and said pair of alignment components on said circuit board are respectively positioned on a pair of contact pads on said circuit board matching in location the location of said pair of alignment holes in said interposer.

* * * * *